(12) United States Patent
Goto et al.

(10) Patent No.: US 11,329,624 B2
(45) Date of Patent: May 10, 2022

(54) RESONATOR AND RESONANCE DEVICE

(71) Applicant: Murata Manufacturing Co., Ltd., Nagaokakyo (JP)

(72) Inventors: Yuichi Goto, Nagaokakyo (JP); Masakazu Fukumitsu, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 694 days.

(21) Appl. No.: 16/210,222

(22) Filed: Dec. 5, 2018

(65) Prior Publication Data

US 2019/0109578 A1 Apr. 11, 2019

Related U.S. Application Data

(63) Continuation of application No. PCT/JP2017/023622, filed on Jun. 27, 2017.

(30) Foreign Application Priority Data

Jul. 5, 2016 (JP) .............................. JP2016-133537

(51) Int. Cl.
*H03H 9/10* (2006.01)
*H03H 9/24* (2006.01)
(Continued)

(52) U.S. Cl.
CPC .............. *H03H 9/10* (2013.01); *B81B 3/0045* (2013.01); *B81B 3/0097* (2013.01);
(Continued)

(58) Field of Classification Search
CPC ...... H03H 9/10; H03H 9/0595; H03H 9/2405; H03H 9/2489; H03H 9/1035;
(Continued)

(56) References Cited

U.S. PATENT DOCUMENTS 7,531,945 B2  5/2009  Aratake
7,589,458 B2  9/2009  Aratake
(Continued)

FOREIGN PATENT DOCUMENTS

JP      2000036723 A    2/2000
JP      2002009578 A    1/2002
(Continued)

OTHER PUBLICATIONS

International Search Report issued for PCT/JP2017/023622, dated Aug. 29, 2017.
(Continued)

*Primary Examiner* — J. San Martin
(74) *Attorney, Agent, or Firm* — ArentFox Schiff LLP

(57) ABSTRACT

A resonator that includes a vibrating portion that has a piezoelectric film, and a lower and upper electrodes that face each other with the piezoelectric film interposed therebetween. Moreover, a holding portion is provided at least around a maximum displacement region of the vibrating portion and has an insulating film. A holding arm connects the vibrating portion and the holding portion, and include a conductive portion that is in contact with the insulating film of the holding portion in at least a region that faces the maximum displacement region of the vibrating portion. In addition, the conductive portion is electrically connected to the lower electrode or the upper electrode or is grounded.

18 Claims, 13 Drawing Sheets

(51) Int. Cl.
*B81B 3/00* (2006.01)
*H03H 9/05* (2006.01)
*H01L 41/113* (2006.01)
*H03H 9/15* (2006.01)

(52) U.S. Cl.
CPC ....... *H01L 41/1138* (2013.01); *H03H 9/0595* (2013.01); *H03H 9/15* (2013.01); *H03H 9/2405* (2013.01); *H03H 9/2489* (2013.01); *B81B 2201/0271* (2013.01); *B81B 2201/032* (2013.01); *B81B 2203/0163* (2013.01); *H03H 9/1035* (2013.01); *H03H 2009/155* (2013.01); *H03H 2009/241* (2013.01); *H03H 2009/2442* (2013.01)

(58) Field of Classification Search
CPC ..... H03H 2009/241; H03H 2009/2442; H03H 2009/155; H03H 2009/08; H03H 2009/19; H03H 2009/21; H03H 2009/215; B81B 3/0097; B81B 3/0045; B81B 2201/0271; B81B 2201/032; B81B 2203/0163; H01L 41/1138
See application file for complete search history.

(56) References Cited

U.S. PATENT DOCUMENTS

| | | | | |
|---|---|---|---|---|
| 8,089,200 | B2* | 1/2012 | Kawahara | H03H 9/0595 |
| | | | | 310/344 |
| 2007/0046151 | A1* | 3/2007 | Aratake | H03H 9/0595 |
| | | | | 310/344 |
| 2009/0140611 | A1 | 6/2009 | Aratake | |
| 2011/0163637 | A1* | 7/2011 | Hashi | H03H 9/21 |
| | | | | 310/344 |
| 2012/0217846 | A1* | 8/2012 | Takahashi | H03H 9/1035 |
| | | | | 310/346 |
| 2013/0069489 | A1 | 3/2013 | Mizusawa | |
| 2018/0191329 | A1* | 7/2018 | Nishimura | H03H 9/02433 |

FOREIGN PATENT DOCUMENTS

| | | |
|---|---|---|
| JP | 2003101362 A | 4/2003 |
| JP | 2007060484 A | 3/2007 |
| JP | 2012065293 A | 3/2012 |
| JP | 2013066109 A | 4/2013 |

OTHER PUBLICATIONS

Written Opinion of the International Searching Authority issued for PCT/JP2017/023622, dated Aug. 29, 2017.

* cited by examiner

RESONATOR AND RESONANCE DEVICE

CROSS REFERENCE TO RELATED APPLICATIONS

The present application is a continuation of PCT/JP2017/023622 filed Jun. 27, 2017, which claims priority to Japanese Patent Application No. 2016-133537, filed Jul. 5, 2016, the entire contents of each of which are incorporated herein by reference.

TECHNICAL FIELD

The present disclosure relates to a resonator and a resonance device.

BACKGROUND

Resonator, such as a piezoelectric vibrator, are currently used for providing a timer function in an electronic apparatus. With miniaturization of the electronic apparatus, the resonator also needs to be miniaturized, and resonators manufactured using MEMS (Micro Electro Mechanical Systems) technology (hereinafter, also referred to as an "MEMS resonator") have attracted attention.

In the MEMS resonator, a resonant frequency can vary due to manufacturing variation. Therefore, the frequency is adjusted by additional etching or the like during manufacturing or after manufacturing of the MEMS resonator.

For example, Patent Document 1 (identified below) discloses the configuration in which, in a vibrator having a plurality of vibrating arms, a resonant frequency is adjusted by reducing each of a mass portion for coarse adjustment, which is provided at the side of front ends of the vibrating arms, and a mass portion for fine adjustment, which is provided at the side of base ends of the vibrating arms.

Patent Document 1: Japanese Unexamined Patent Application Publication No. 2012-065293.

A conventional resonator has the configuration in which a rectangular vibrating portion (vibrating body) is connected to a holding portion by a holding arm and a surface of the holding portion is covered with an insulating film. In such a resonator, for example, an electric field or the like, which is generated at the time of formation of a thin film, may cause the insulating film on the holding portion to be charged. In addition, when a frequency adjustment method using an ion beam as described in Patent Document 1 is used for such a conventional resonator, irradiation of the holding portion with the ion beam causes the insulating film on the holding portion to be charged in some cases. As a result, a Coulomb force is generated between the holding portion and the vibrating portion, and the resonant frequency varies.

SUMMARY OF THE INVENTION

The present disclosure has been made in view of such circumstances. Thus, it is an object thereof to suppress influences on a resonant frequency by electric charges accumulated in a charged insulating film on a holding portion.

Accordingly, a resonator according to an exemplary aspect is provided that includes a vibrating portion that has a piezoelectric film, and a lower electrode and an upper electrode provided to face each other with the piezoelectric film interposed therebetween, and vibrates in a predetermined vibration mode. Moreover, a holding portion is provided at least around a maximum displacement region of the vibrating portion in which displacement with vibration is maximum, and has an insulating film. In addition, a holding arm is provided that connects the vibrating portion and the holding portion, and a conductive portion that is formed in contact with the insulating film of the holding portion in at least a region of the holding portion, which faces the maximum displacement region of the vibrating portion. In an exemplary aspect, the conductive portion is electrically connected to the lower electrode or the upper electrode, or is grounded.

According to the resonator of the exemplary embodiment, influences on a resonant frequency by electric charges accumulated in a charged insulating film on a holding portion can be suppressed.

DESCRIPTION OF EMBODIMENTS

First Exemplary Embodiment

Figure 1:
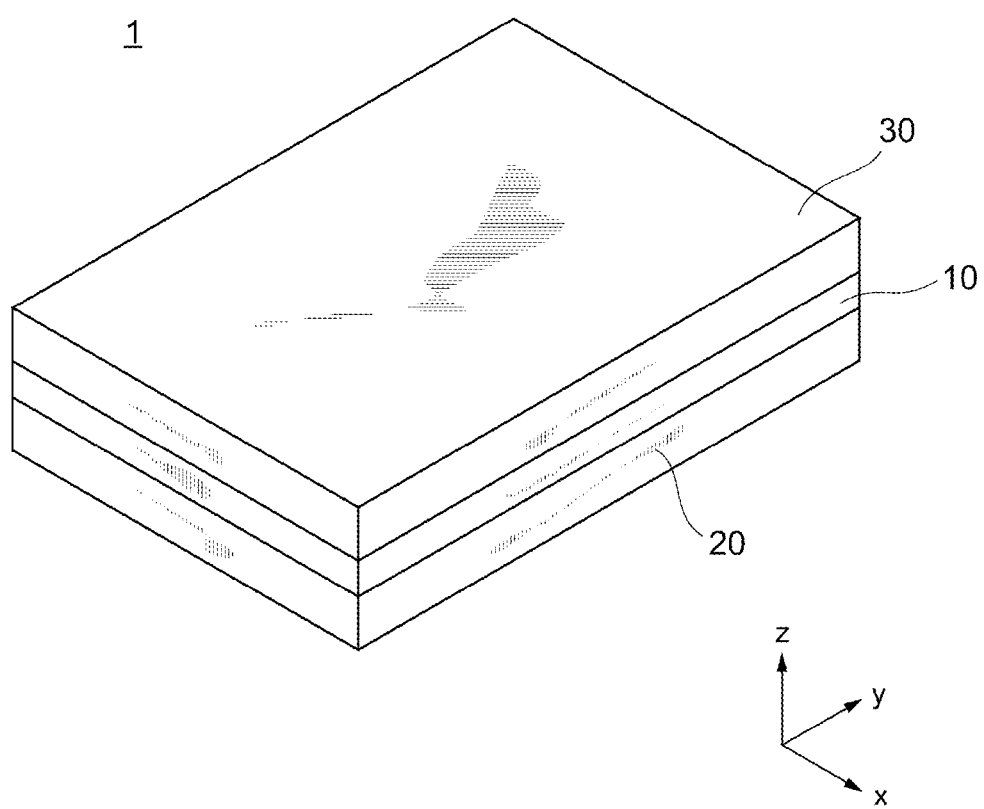
FIG. 1 is a perspective view schematically illustrating an outer appearance of a resonance device according to a first exemplary embodiment.
Figure 2:
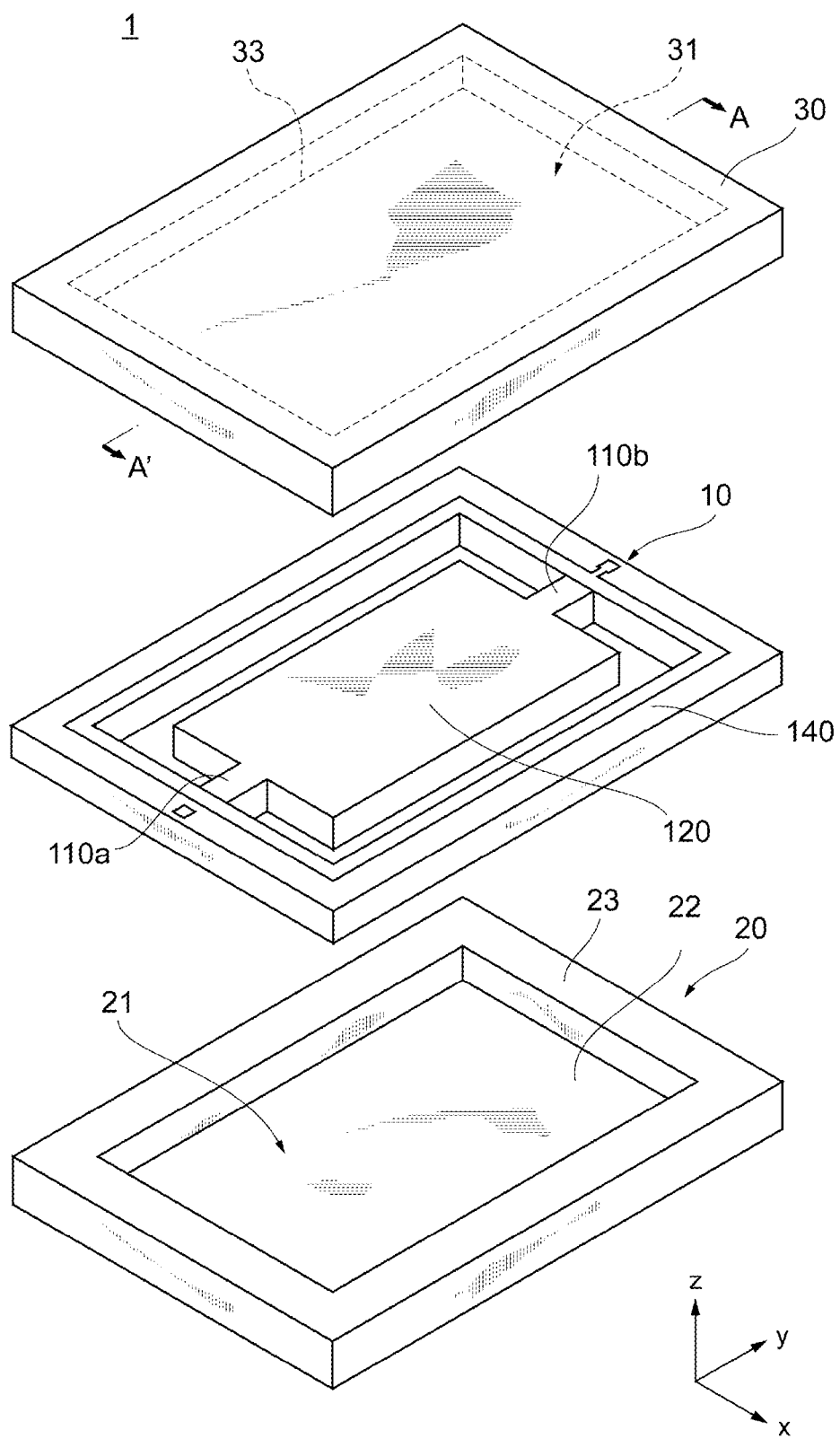
FIG. 2 is an exploded perspective view schematically illustrating the configuration of the resonance device according to the first exemplary embodiment.

Hereinafter, a first exemplary embodiment will be described with reference to the accompanying drawings. FIG. 1 is a perspective view schematically illustrating an outer appearance of a resonance device 1 according to the first embodiment. FIG. 2 is an exploded perspective view schematically illustrating the configuration of the resonance device 1 according to the first exemplary embodiment.

The resonance device 1 includes a resonator 10, an upper lid 30 and a lower lid 20 that are provided so as to face each other with the resonator 10 interposed therebetween. In other words, the resonance device 1 is configured by laminating the lower lid 20, the resonator 10, and the upper lid 30 in this order.

Further, the resonator 10, the lower lid 20 and the upper lid 30 are joined together, thereby sealing the resonator 10 and forming a vibration space of the resonator 10. Each of the resonator 10, the lower lid 20 and the upper lid 30 is formed using an Si substrate. The resonator 10, the lower lid 20 and the upper lid 30 are joined (i.e., coupled) together by joining the Si substrates to each other. The resonator 10 and the lower lid 20 may be formed using an SOI substrate.

According to the exemplary aspect, the resonator 10 is a MEMS resonator that is manufactured using MEMS technology. It is noted that in the embodiment, the resonator 10 is formed using the silicon substrate, as an example. Hereinafter, the respective configurations of the resonance device 1 will be described in detail.

Upper Lid 30

The upper lid 30 has a flat plate shape extending along an XY plane.

Lower Lid 20

The lower lid 20 has a rectangular flat plate-shaped bottom plate 22 provided along the XY plane and a side wall 23 extending from a peripheral edge portion of the bottom plate 22 in a Z-axis direction (i. e., in the lamination direction of the lower lid 20 and the resonator 10). In a surface of the lower lid 20, which faces the resonator 10, a recess 21 formed by the surface of the bottom plate 22 and the inner surface of the side wall 23 is provided. The recess 21 forms a part of the vibration space of the resonator 10. With the above-described upper lid 30 and lower lid 20, this vibration space is hermetically sealed and a vacuum state is maintained. The vibration space may be filled with gas such as an inert gas, for example.

Resonator 10

Figure 3:
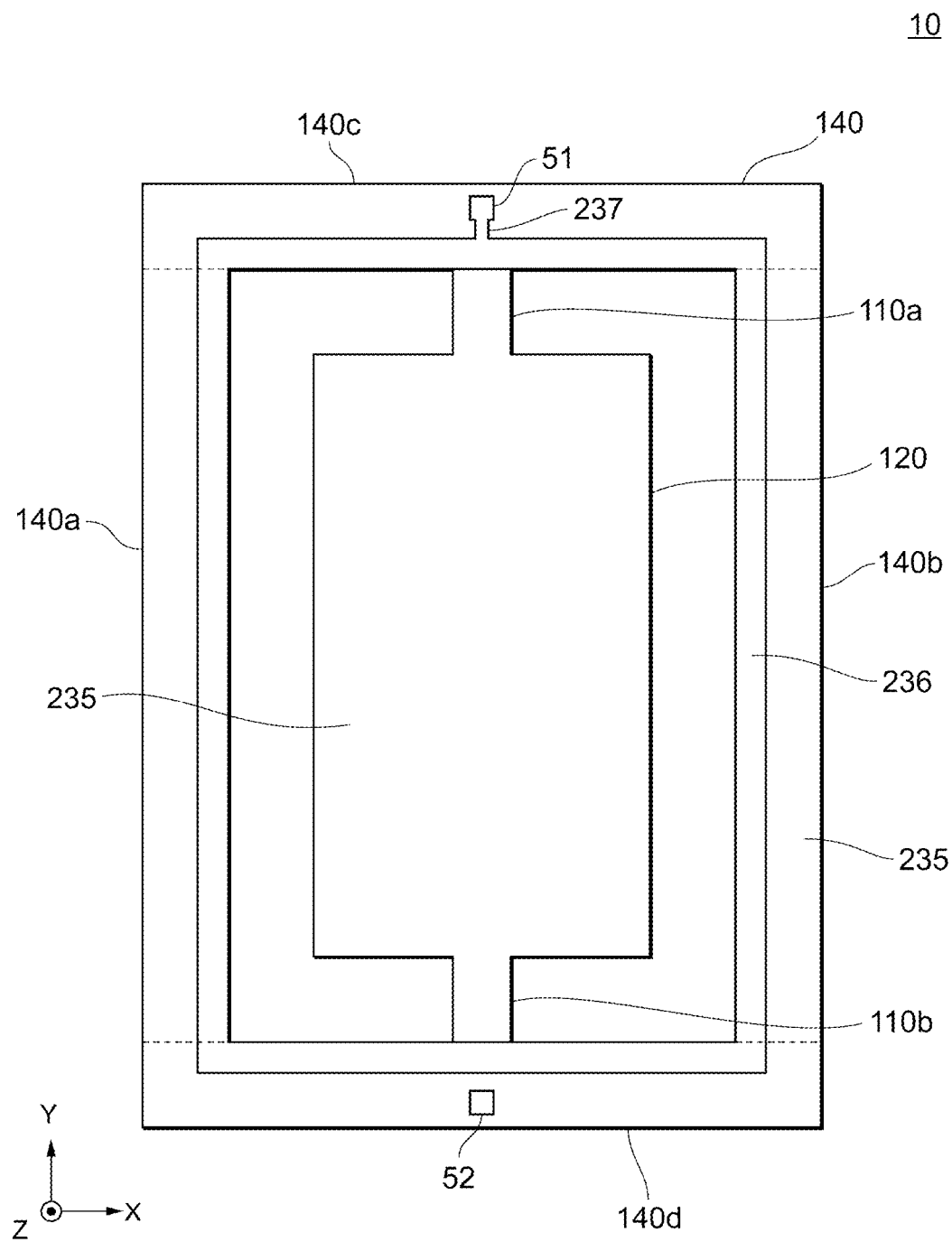
FIG. 3 is a plan view of a resonator according to the first exemplary embodiment in which an upper substrate has been removed.

FIG. 3 is a plan view schematically illustrating the structure of the resonator 10 according to the embodiment. The respective configurations of the resonator 10 according to the embodiment will be described with reference to FIG. 3. It is noted that in FIG. 3, configurations necessary for explaining at least a part of characteristics of the structure of the resonator 10 are extracted and illustrated but the illustration does not prevent the resonator 10 from including configurations which are not illustrated in the drawing. The resonator 10 includes a vibrating portion 120, a holding portion 140, holding arms 110a and 110b, a conductive portion 236, a wiring 237, and terminals 51 and 52.

Vibrating Portion 120

The vibrating portion 120 (also referred to as a vibrating member or vibrator) has a rectangular contour extending along the XY plane in an orthogonal coordinate system of FIG. 3. Moreover, the vibrating portion 120 is provided in an inner side portion relative to the holding portion 140, and a space is formed between the vibrating portion 120 and the holding portion 140 at a predetermined interval. The vibrating portion 120 has long sides in a Y-axis direction and short sides in an X-axis direction.

Although details will be described with reference to FIGS. 4 and 5, a metal layer E2, which will be described later, is formed on the vibrating portion 120, so that the vibrating portion 120 has one upper electrode having a surface facing the surface of an Si substrate F2 (see FIG. 4) and has one vibration region corresponding to the one upper electrode. The vibration region is configured such that the vibrating portion 120 undergoes contour vibration in the X-axis direction while regions of connection sites between the vibrating portion 120 and holding arms 110, which will be described later, are nodes. In the vibrating portion 120 according to the embodiment, displacement with the vibration is maximum at four corners thereof (see FIG. 5).

It is noted that the vibrating portion 120 may have a plurality of upper electrodes, and in this case, the vibrating portion 120 has a plurality of vibration regions divided in accordance with the number of the plurality of upper electrodes.

According to the exemplary aspect, an insulating film 235 is formed (i.e., disposed) on the surface of the vibrating portion 120 (a surface facing the upper lid 30) so as to cover the entire surface thereof. Although it is not necessary for the insulating film 235 to cover the entire surface of the vibrating portion 120, it is desirable that the insulating film 235 covers the entire surface of the vibrating portion 120 for protecting a piezoelectric film (e. g., a piezoelectric thin film F3 of FIG. 4) from being damaged according to the exemplary embodiment.

(b) Holding Portion 140

The holding portion 140 (also referred to as a "holding member") is formed into a rectangular frame shape along the XY plane and can be considered a frame for the vibration portion 120 according to an exemplary aspect. In plan view, the holding portion 140 is provided so as to surround an outer side portion of the vibrating portion 120 along the XY plane. It is sufficient that the holding portion 140 is provided at least around maximum displacement regions of the vibrating portion 120 (in the embodiment, regions at the four corners of the vibrating portion 120) in which the displacement with the vibration is maximum, and is not limited to have the frame shape. For example, the holding portion 140 may hold the vibrating portion 120, and may be provided around the vibrating portion 120 in a degree capable of joining to the upper lid 30 and the lower lid 20.

In this embodiment, the holding portion 140 includes frame bodies 140a, 140b, 140c and 140d. As illustrated in FIG. 2, the frame bodies 140a to 140d have prismatic shapes that are integrally formed. As illustrated in FIG. 3, the frame bodies 140a and 140b extend in parallel to the Y-axis direction so as to face the long sides of the vibrating portion 120. Further, the frame bodies 140c and 140d extend in parallel to the X-axis direction so as to face the short sides of the vibrating portion 120, and are connected, at both ends, to both ends of the frame bodies 140a and 140b.

As further shown, the frame bodies 140c and 140d are connected to the holding arms 110 in the vicinity of the centers thereof. Further, the frame bodies 140c and 140d include the terminals 51 and 52, respectively, in the vicinity of the connection places to the holding arms 110. The terminal 51 is a terminal for connecting the upper electrode E2 (see FIG. 4), which will be described later, to the outside. Further, the terminal 52 is a terminal for connecting a lower electrode E1 (see FIG. 4), which will be described later, to the outside.

Further, the surface of the holding portion 140 is covered with the insulating film 235.

(c) Holding Arms 110

The holding arms 110a and 110b (hereinafter, also collectively referred to as "holding arms 110") are prismatic arms, and are provided in an inner side portion relative to the holding portion 140 and in a space between the short sides of the vibrating portion 120 and the frame bodies 140c and 140d. The holding arms 110a and 110b connect the respective short sides of the vibrating portion 120 to the frame bodies 140c and 140d.

Although in this embodiment, the holding arms 110 are covered with the insulating film 235, the exemplary embodiments should not be so limited thereto and the insulating film 235 may not be formed on the surfaces of the holding arms 110.

(d) Conductive Portion 236

The conductive portion 236 is formed along an inner edge of the holding portion 140 on the holding portion 140. Specifically, the conductive portion 236 is provided at a position at which an inner edge thereof substantially coincides with the inner edge of the holding portion 140, and an outer edge thereof is located between the inner edge and an outer edge of the holding portion 140 in plan view. A width of the conductive portion 236 from the inner edge toward the outer edge is, for example, about 10 µm. Preferably, the outer edge of the conductive portion 236 is not located in a region on the holding portion 140 in which a joining layer 35 (not illustrated in FIG. 3 and see FIG. 4), which will be described later, is formed. For example, the configuration in which an interval larger than a width of the joining layer 35, which will be described later, is provided between the outer edge of the conductive portion 236 and the outer edge of the holding portion 140 is desirable, but the outer edge of the conductive portion 236 and the outer edge of the holding portion 140 may coincide with each other.

According to the exemplary embodiment, it is sufficient that the conductive portion 236 is formed so as to make contact with the insulating film 235 of the holding portion 140 in at least regions facing the maximum displacement regions of the vibrating portion 120 in which the displacement with the vibration is maximum (in the embodiment, the four corners of the vibrating portion 120). The configuration of the conductive portion 236 in this case will be described in the second to fourth embodiments.

(e) Terminals 51 and 52

Terminals 51 and 52 are input/output terminals that connect the outer electrode and the resonator. The terminal 51 is a hole filled with metal, which is formed in the frame body 140c of the holding portion 140, and connects the metal layer E2 (see FIG. 4) and the outer electrode. Further, the conductive portion 236 is connected to the terminal 51. That is, at the terminal 51, the metal layer E2 (see FIG. 4) and the conductive portion 236 are electrically connected to each other.

On the other hand, the terminal 52 is a hole filled with metal, which is formed on the frame body 140d of the holding portion 140, and connects the metal layer E1 (see FIG. 4) and the outer electrode.

(f) Wiring 237

The wiring 237 draws the conductive portion 236 to the terminal 51 and connects the terminal 51 and the conductive portion 236 to each other. It is noted that the wiring 237 may be configured to draw the conductive portion 236 to the terminal 52 and connect the terminal 52 and the conductive portion 236 to each other. Further, the wiring 237 may be configured to connect the conductive portion 236 to a ground terminal (not illustrated).

Laminated Structure

Next, a laminated structure and constituent materials of the resonator 10 will be described with reference to FIG. 4. FIG. 4 is a schematic view schematically illustrating a cross section taken along a line A-A' of FIG. 2.

Figure 4:
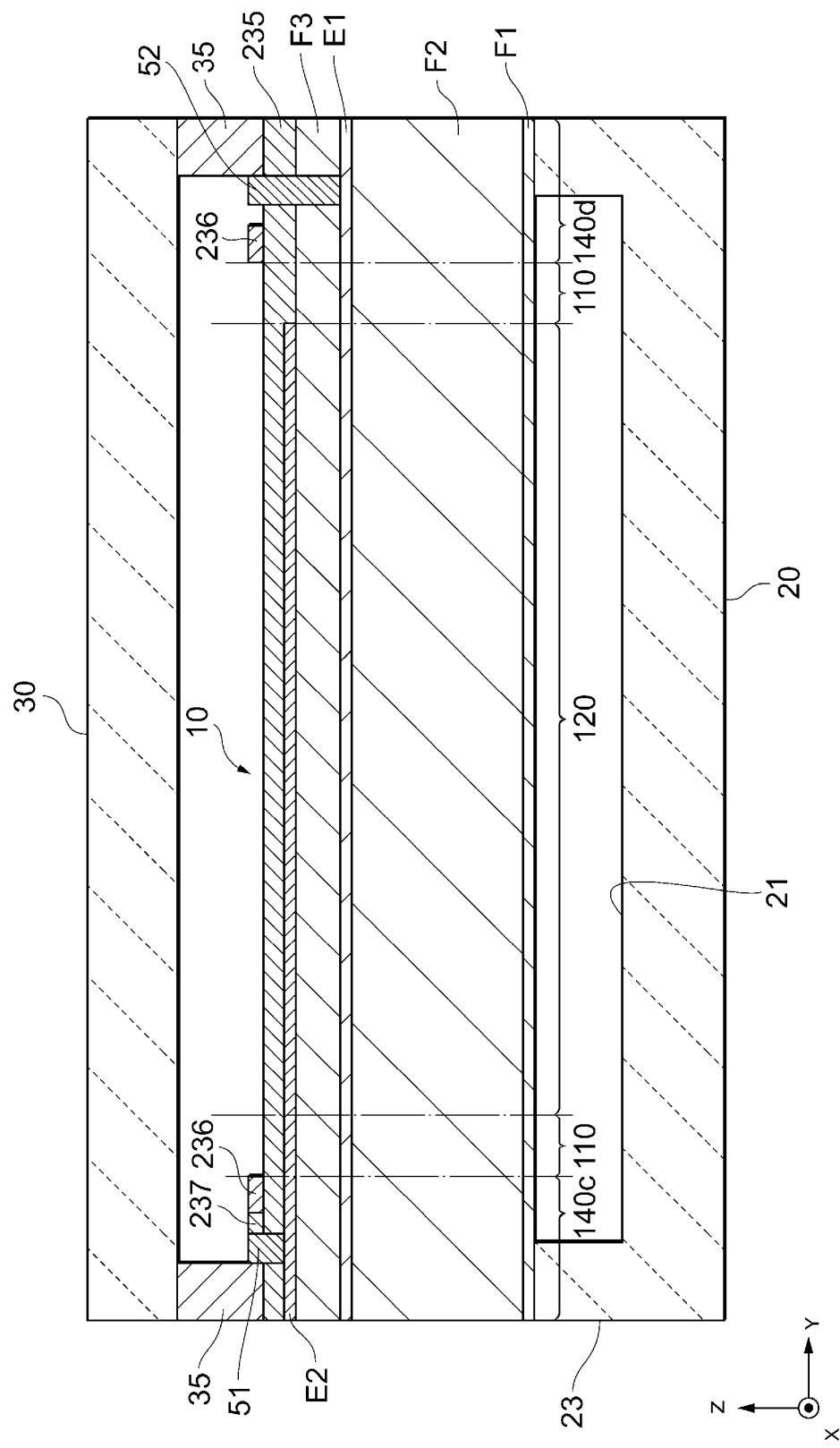
FIG. 4 is a cross-sectional view taken along a line A-A' of FIG. 3.

As illustrated in FIG. 4, in the resonance device 1 according to the embodiment, the side wall 23 of the lower lid 20 and the holding portion 140 of the resonator 10 are joined to each other, and the holding portion 140 of the resonator 10 and a side wall 33 of the upper lid 30 are joined to each other. Thus, the resonator 10 is held between the lower lid 20 and the upper lid 30, and the vibration space in which the vibrating portion 120 vibrates is formed between the lower lid 20 and the upper lid 30.

In the exemplary aspect, the bottom plate 22 and the side wall 23 of the lower lid 20 are integrally formed of Si (silicon). The configuration may be adopted in which a silicon oxide (e. g., $SiO_2$) film is formed on the upper surface of the side wall 23 and the lower lid 20 is joined to the holding portion 140 of the resonator 10 by the silicon oxide film. The thickness of the lower lid 20, which is defined in the Z-axis direction, is, for example, 150 µm, and the depth of the recess 21 is, for example, 50 µm.

Moreover, the upper lid 30 is formed of Si (silicon) wafer having a predetermined thickness. As illustrated in FIG. 4, the upper lid 30 is joined to the holding portion 140 of the resonator 10 at its peripheral edge portion (the side wall 33). The joining layer 35 is formed between a peripheral edge portion of the upper lid 30 and the holding portion 140, and the upper lid 30 is joined to the holding portion 140 by the joining layer 35. The joining layer 35 is formed of, for example, an Au (gold) film and an Sn (tin) film.

In the exemplary embodiment, the resonator 10, the holding portion 140, the vibrating portion 120, and the holding arms 110 are integrally formed by the same process. In the resonator 10, first, the metal layer E1 is laminated on the Si (silicon) substrate F2. Then, the piezoelectric thin film F3 (an example of a piezoelectric film) is laminated on the metal layer E1 so as to cover the metal layer E1, and the metal layer E2 is further laminated on the surface (an example of an upper surface) of the piezoelectric thin film F3. The insulating film 235 is laminated on the metal layer E2 so as to cover the metal layer E2. On the holding portion 140, the conductive film 236 is further laminated on the insulating film 235. Usage of a degenerated silicon substrate which has low resistance enables the Si substrate F2 itself to also serve as the metal layer E1, thereby omitting the metal layer E1.

The Si substrate F2 is formed of, for example, a degenerated n-type Si semiconductor having a thickness of about 6 µm, and can contain P (phosphorus), As (arsenic), Sb (antimony), or the like as an n-type dopant. A resistance value of degenerated Si used for the Si substrate F2 is, for example, smaller than 1.6 mΩ·cm, and more preferably, is equal to or smaller than 1.2 mΩ·cm. Further, on the lower surface of the Si substrate F2, a silicon oxide (e. g., $SiO_2$) layer (temperature characteristic correction layer) F1 is formed. Thus, temperature characteristics can be improved.

In this embodiment, the silicon oxide layer (temperature characteristic correction layer) F1 is a layer that is configured to reduce a temperature coefficient (i. e., a change rate per temperature) of a frequency in the vibrating portion at at least the approximate normal temperature when the temperature characteristic correction layer is formed on the Si substrate F2 as compared with a case where the silicon oxide layer F1 is not formed on the Si substrate F2. Since the vibrating portion 120 has the silicon oxide layer F1, it is possible to reduce change in the resonant frequency of the laminated structure by the Si substrate F2, the metal layers E1 and E2, the piezoelectric thin film F3, and the silicon oxide layer (temperature correction layer) F1 with temperature, for example.

In the resonator 10, the silicon oxide layer F1 is desirably formed with a uniform thickness. The uniform thickness means that variation in the thickness of the silicon oxide layer F1 is within ±20% of a thickness average value.

It is noted that the silicon oxide layer F1 may be formed on the upper surface of the Si substrate F2 or may be formed on both the upper surface and the lower surface of the Si substrate F2. In addition, in the holding portion 140, the silicon oxide layer F1 may not be formed on the lower surface of the Si substrate F2.

The metal layers E2 and E1 are formed of, for example, Mo (molybdenum) or aluminum (Al) having a thickness of about 0.1 to 0.2 μm. The metal layers E2 and E1 are formed into desired shapes by etching or the like. The metal layer E1 is formed, for example, on the vibrating portion 120 so as to function as the lower electrode. Further, the metal layer E1 is formed on the holding arms 110 and the holding portion 140 so as to function as a wiring for connecting the lower electrode to an AC power supply provided outside the resonator 10.

On the other hand, the metal layer E2 is formed on the vibrating portion 120 so as to be configured as the upper electrode. Further, the metal layer E2 is formed on the holding arms 110a and 110b and the holding portion 140 so as to be configured as a wiring for connecting the upper electrode to a circuit provided outside the resonator 10.

For connection from the AC power supply to the lower wiring or the upper wiring, the configuration in which an electrode (an example of an outer electrode) is formed on an outer surface of the upper lid 30 and the electrode connects the circuit and the lower wiring or the upper wiring or the configuration in which a via is formed in the upper lid 30, the via is filled with a conductive material to provide a wiring, and the wiring connects the AC power supply and the lower wiring or the upper wiring may be used. Alternatively, it is also possible to employ the configuration in which a ground terminal is formed on the outer surface of the upper lid 30 and the lower wiring is grounded.

The piezoelectric thin film F3 is a thin film of a piezoelectric body that converts an applied voltage into vibration, and can mainly contain nitride such as AlN (aluminum nitride) or oxide, for example. Specifically, the piezoelectric thin film F3 can be formed of ScAlN (scandium aluminum nitride). ScAlN is provided by substituting a part of aluminum in aluminum nitride with scandium. Further, although the piezoelectric thin film F3 has a thickness of, for example, 1 μm, it is also possible to use the piezoelectric thin film F3 having a thickness of about 0.2 μm to 2 μm.

The insulating film 235 is a layer of an insulator, and is formed on the entire surface of the resonator 10 in the embodiment. For example, the insulating film 235 is formed of a nitride film using AlN, SiN, or the like, or an oxide film using $Ta_2O_5$ (tantalum pentoxide), $SiO_2$, or the like. The thickness of the insulating film 235 is, for example, about 0.2 μm.

The terminal 51 is formed by filling, with a conductor, a hole provided by removing a part of the insulating film 235 such that the surface of the metal layer E2 is exposed. In addition, the terminal 52 is formed by filling, with a conductor, a hole provided by removing a part of the insulating film 235 and a part of the piezoelectric thin film F3 such that the surface of the metal layer E1 is exposed. The conductor filling the terminals 51 and 52 is, for example, Mo (molybdenum), aluminum (Al), or the like.

The conductive portion 236 and the wiring 237 are layers of a conductor. The conductive portion 236 and the wiring 237 are made of, for example, metal such as molybdenum (Mo), tungsten (W), gold (Au), platinum (Pt), nickel (Ni), aluminum (Al), and titanium (Ti).

After being formed on substantially the entire surface of the holding portion 140, the conductive portion 236 is formed only in a predetermined region by processing such as etching. In the example of FIG. 4, the conductive portion 236 is formed between the inner edge of the holding portion 140 and the joining layer 35. Further, the conductive portion 236 is electrically connected to the outer electrode with the terminal 51 which connects the metal layer E2 to the outside interposed therebetween.

Functions of Resonator

Next, functions of the resonator 10 will be described. In this embodiment, the piezoelectric thin film F3 expands and contracts in the in-plane direction of the XY plane, i. e., in the Y-axis direction, according to an electric field applied to the piezoelectric thin film F3 by the metal layer E2 (upper electrode) and the metal layer E1 (lower electrode) formed on the vibrating portion 120. Specifically, the piezoelectric thin film F3 is oriented in a Z-axis direction, and therefore, when a predetermined electric field is applied to the metal layer E2 (upper electrode) and the metal layer E1 (lower electrode) to form a predetermined potential difference between the metal layer E2 (upper electrode) and the metal layer E1 (lower electrode), the piezoelectric thin film F3 expands and contracts in the XY in-plane direction in accordance with the potential difference, whereby the vibration region undergoes contour vibration.

Figure 5:
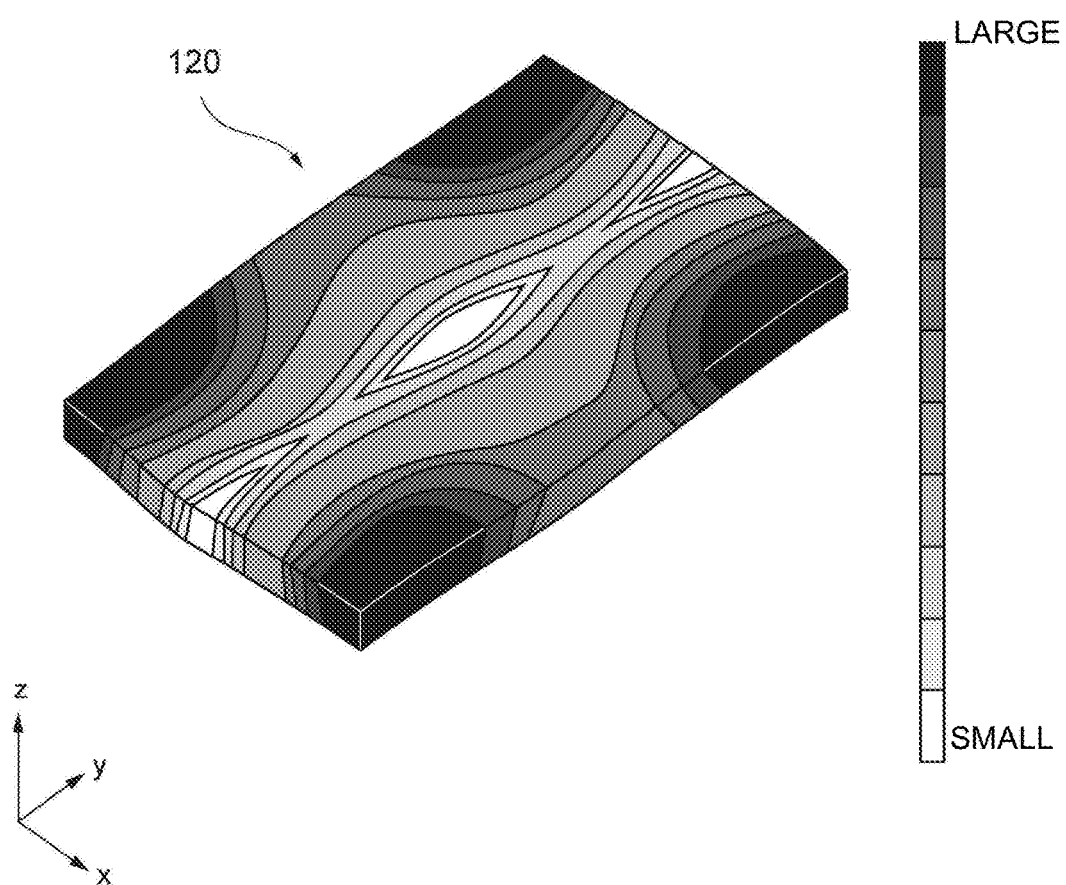
FIG. 5 is a view illustrating a result of analysis of a vibration mode of the resonator according to the first exemplary embodiment.

FIG. 5 is a view illustrating a result of analysis of a vibration mode of the resonator 10 according to the embodiment by FEM. In FIG. 5, an analysis result for the vibrating portion 120 of the resonator 10 is extracted and illustrated. In FIG. 5, light-colored regions indicate regions in which the displacement with the vibration is small and dark-colored regions indicate regions in which the displacement with the vibration is large.

From the result illustrated in FIG. 5, it can be seen that in the vibrating portion 120, the displacement with the vibration is maximum at its four corners.

Functions of Conductive Portion

Next, functions of the conductive film 236 will be described. The resonator 10 according to the exemplary embodiment is configured such that the insulating film 235 is formed (i.e., disposed) on the holding portion 140. In the resonator 10, the insulating film 235 on the holding portion 140 may be charged in some cases due to various factors.

For example, the insulating film 235 on the holding portion 140 is charged by an electric field or the like, which is generated at the time of formation of the thin film in the resonator 10. In addition, when a pyroelectric body is used for the insulating film 235, a pyroelectric effect is generated by temperature rise and fall due to heat, so that electric charges are generated at an interface of the insulating film 235. Further, when a film for frequency adjustment is formed on the vibrating portion 120 and a resonant frequency is adjusted by an ion beam or the like, the insulating film 235 on the holding portion 140 is charged also by irradiation of the holding portion 140 with the ion beam.

When the insulating film 235 on the holding portion 140 is charged due to such factors, a Coulomb force is generated between the holding portion 140 and the vibrating portion 120, thereby causing the resonant frequency to vary.

In the resonator 10 according to the embodiment, the conductive portion 236 is formed on the insulating film 235 and is connected to the terminal 51 connected to the outer electrode. Thus, the electric charges accumulated in the charged insulating film 235 can be released to the outside of the resonance device 1 while passing through the terminal 51 which is a connection terminal to the outside. In this way, in the resonator 10 according to the embodiment, it is possible to suppress the insulating film 235 formed on the holding portion 140 from being charged and thus prevent the resonant frequency from varying due to the electric charge accumulated in the holding portion 140.

In particular, by forming the conductive portion 236 in the regions (i.e., an example of a second region) of the holding portion 140 near the four corners of the vibrating portion 120 (i.e., regions in which the displacement with the vibration is larger than that in the other regions), the vibrating portion 120 can be driven more stably.

In addition, similar effects can also be obtained when the conductive portion 236 is connected to the terminal 52 or is grounded.

Second Exemplary Embodiment

In the second and subsequent embodiments, description of matters common to those in the first embodiment will be omitted and only different points will be described. In particular, the same operational effects with the same configurations will not be described in each of the embodiments.

Figure 6:
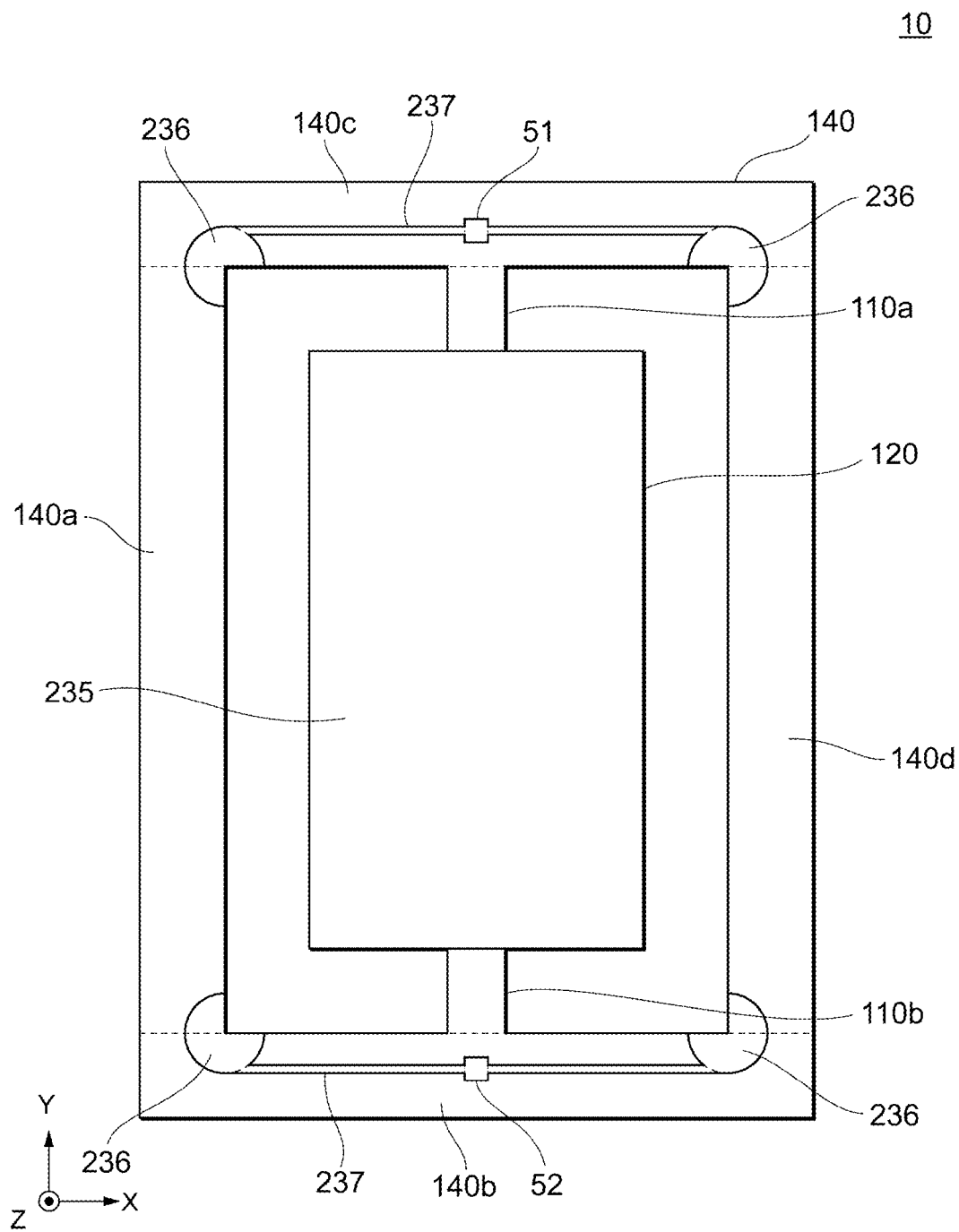
FIG. 6 is a plan view of a resonator according to a second exemplary embodiment.
Figure 7:
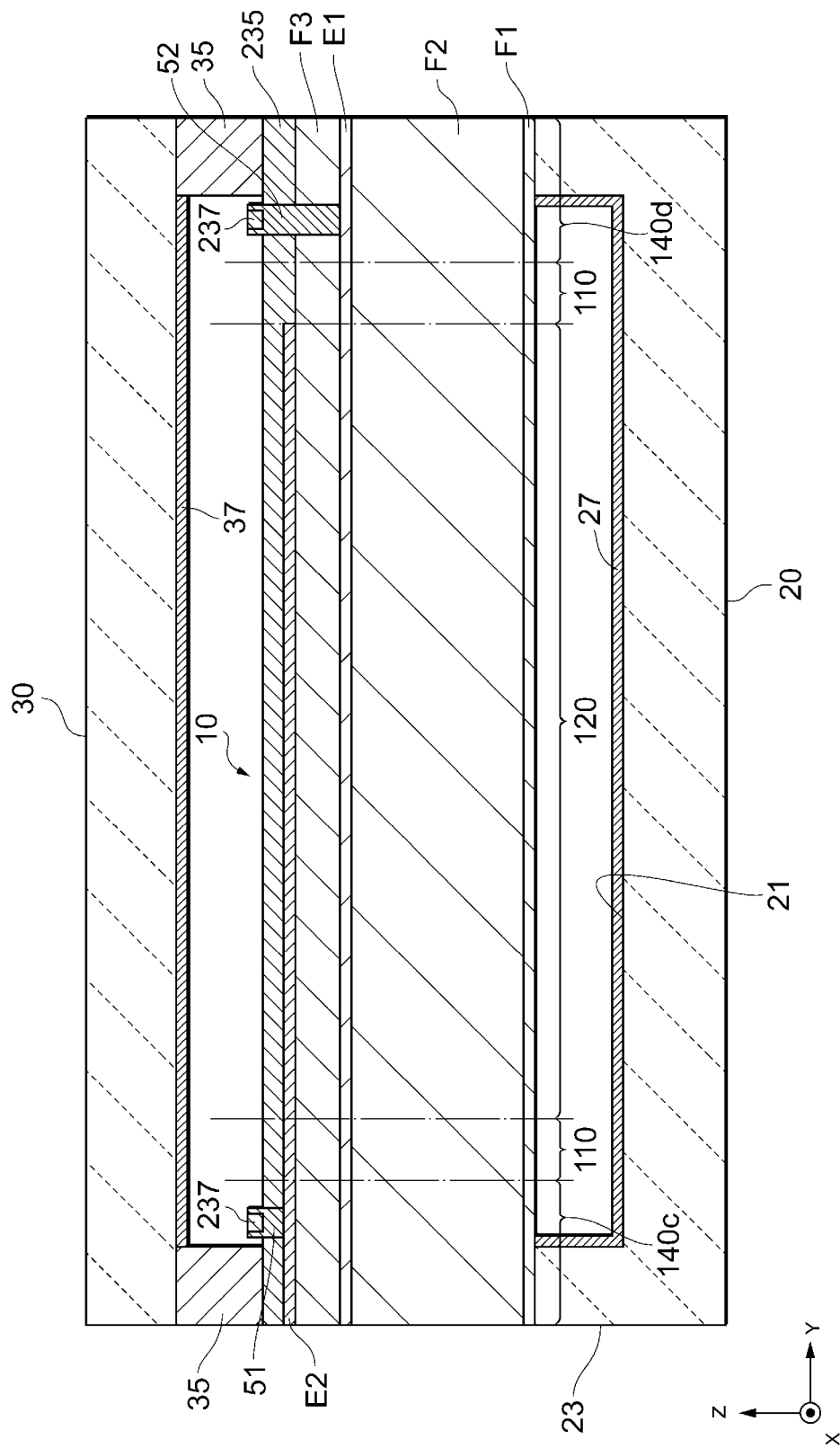
FIG. 7 is a cross-sectional view of a resonance device according to the second exemplary embodiment.

Referring to FIGS. 6 and 7, description will be mainly given to different points from the first embodiment in the detailed configuration of the resonator 10 according to the embodiment. FIG. 6 is a plan view schematically illustrating an example of the configuration of the resonator 10 according to the embodiment (for simplification of explanation, the joining layer 35 is omitted from FIG. 6 in the same way as in FIG. 3). FIG. 7 is a cross-sectional view of the resonance device 1 according to the embodiment, which corresponds to the cross section taken along the line A-A' of FIG. 2.

Upper Lid 30 and Lower Lid 20

As illustrated in FIG. 7, the upper lid 30 and the lower lid 20 have conductive films on surfaces thereof facing the resonator 10. Specifically, the rear surface of the upper lid 30 and the inner wall of the recess 21 of the lower lid 20 are covered with conductive films 37 and 27, respectively. The films 37 and 27 are electrically connected to an outer electrode or a ground terminal with the upper lid 30 and the lower lid 20 interposed therebetween, respectively.

As described above, in the resonance device 1 according to the embodiment, the upper lid 30 and the lower lid 20 have the conductive films 37 and 27 on the surfaces thereof facing the resonator 10, respectively. Thus, it is possible to prevent charging in the vicinity of the vibrating portion 120 and drive the vibrating portion 120 more stably.

Resonator 10

In the resonator 10 according to the exemplary embodiment, the conductive portions 236 are formed in regions of the holding portion 140, which face four corners of the vibrating portion 120 (i.e., maximum displacement regions in which displacement with vibration is maximum) in a limited manner.

Specifically, the conductive portions 236 are formed near corner portions of the holding portion 140 at the inner edge side (i.e., an example of a second region). In an example of FIG. 6, the conductive portions 236 are formed in fan-like shapes from the inner edge of the holding portion 140 toward the outer edge thereof, but the shapes of the conductive portions 236 are not limited thereto. The conductive portions 236 may have belt-like shapes which are bent along the corner portions of the holding portion 140 at the inner edge side.

The two conductive portions 236 formed at the frame body 140c side are drawn by the wiring 237 and are connected to the terminal 51. On the other hand, the two conductive portions 236 formed at the frame body 140d side are drawn by the wiring 237 and are connected to the terminal 52.

It is noted that the configurations of the terminals 51 and 52 are the same as those of the first embodiment, and therefore, description thereof will be omitted.

The other configurations and effects of the resonance device 1 are the same as those of the first embodiment.

Third Exemplary Embodiment

Figure 8:
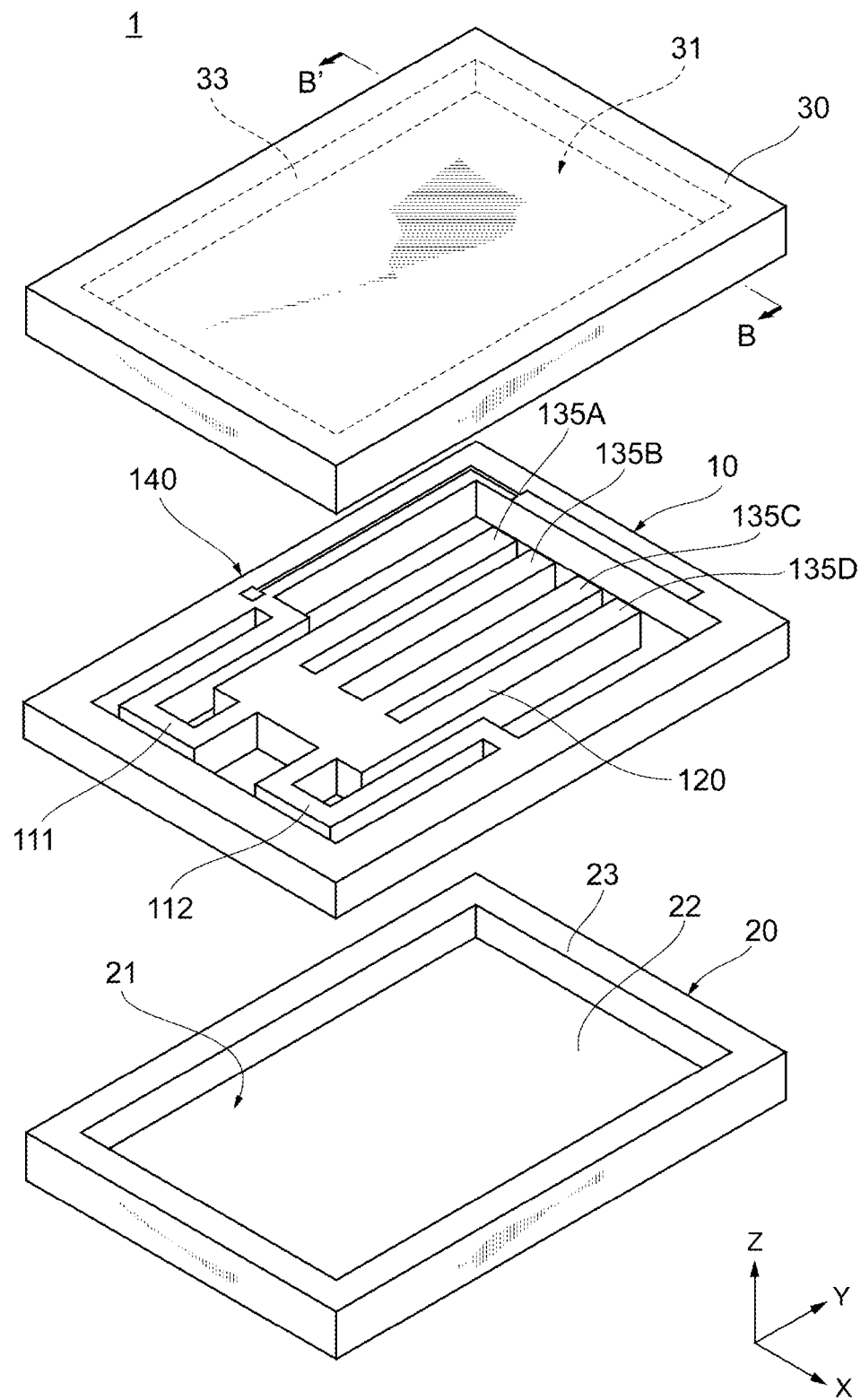
FIG. 8 is an exploded perspective view of a resonance device according to a third exemplary embodiment.
Figure 9:
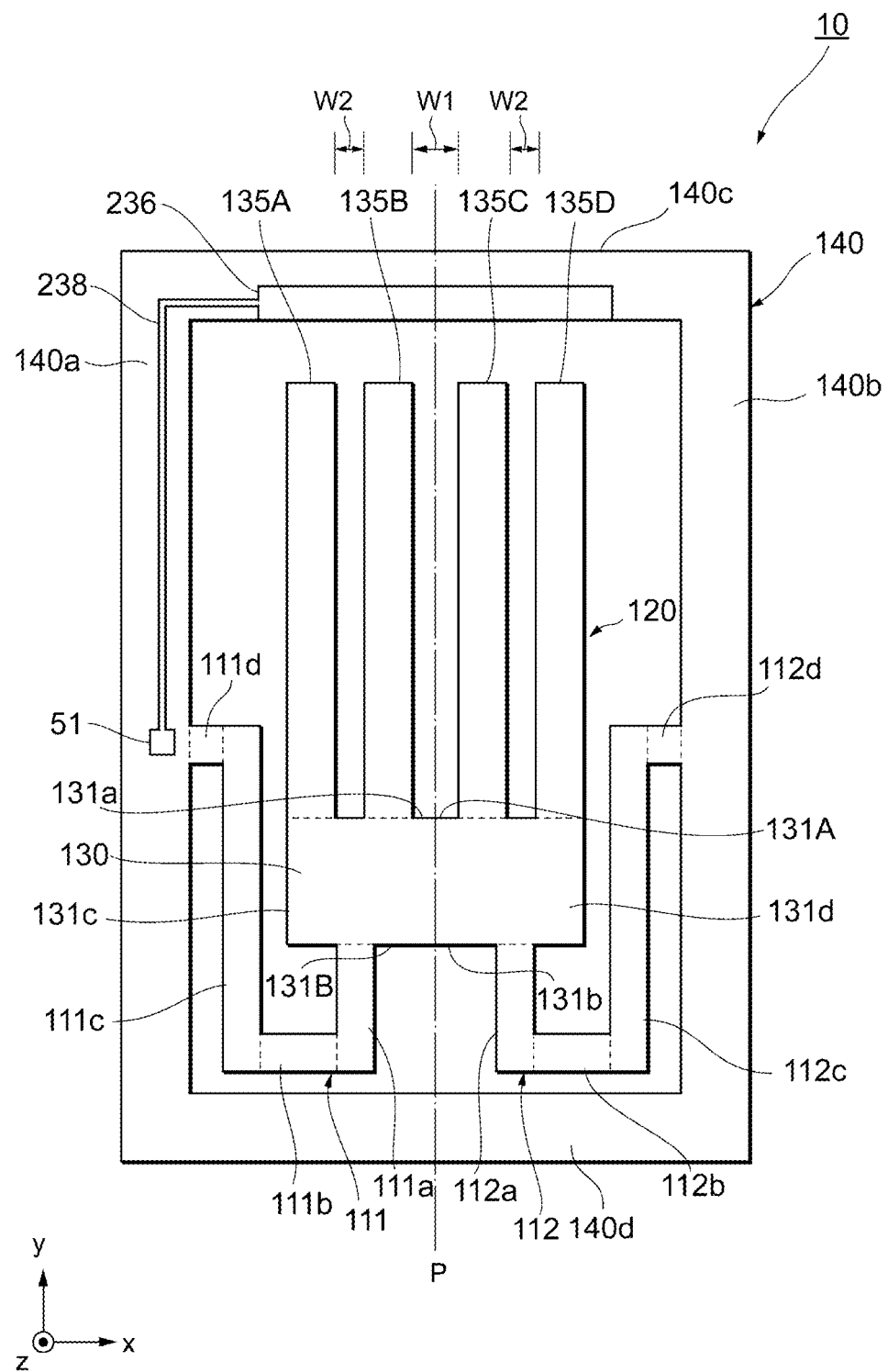
FIG. 9 is a plan view of a resonator according to the third exemplary embodiment.
Figure 10:
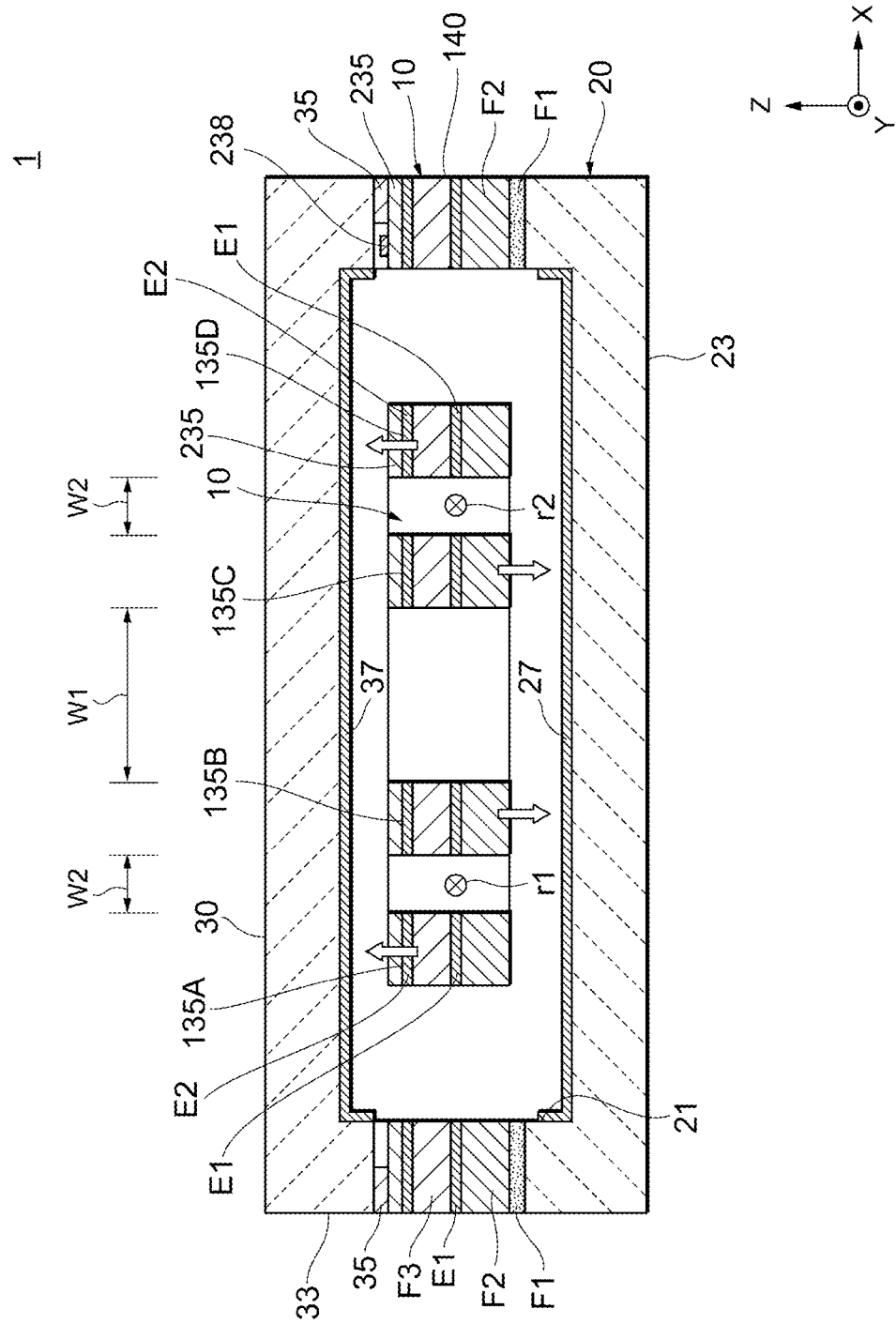
FIG. 10 is a cross-sectional view taken along a line B-B' of FIG. 8.

By referring to FIGS. 8 to 10, description will be given to different points from the first embodiment in the detailed configuration of the resonator 10 according to the embodiment. FIG. 8 is an exploded perspective view of the resonance device 1 according to the embodiment. Further, FIG. 9 is a plan view schematically illustrating an example of the configuration of the resonator 10 according to the embodiment (for simplification of explanation, the joining layer 35 is omitted from FIG. 9 in the same way as in FIG. 3). FIG. 10 is a cross-sectional view taken along a line B-B' of FIG. 8.

Upper Lid 30 and Lower Lid 20

In this embodiment, the upper lid 30 extends in a flat plate shape along an XY plane, and a recess 31 having, for example, a flat rectangular parallelepiped shape is formed in a rear surface thereof. The recess 31 is surrounded by the side wall 33 and forms a part of a vibration space, which is a space in which the resonator 10 vibrates.

As illustrated in FIG. 10, the upper lid 30 and the lower lid 20 have conductive films on surfaces thereof facing the resonator 10. Specifically, inner walls of the recess 31 of the upper lid 30 and the recess 21 of the lower lid 20 are covered with the conductive films 37 and 27, respectively. It is noted that the configurations of the films 37 and 27 are the same as the configurations and effects of the films 37 and 27 in the second embodiment, and therefore, description thereof will be omitted.

In this way, in the resonance device 1 according to the embodiment, the upper lid 30 has the recess 31 and the conductive film 37 is also formed on the inner wall of the recess 31. Thus, it is possible to prevent charging in the vicinity of the vibrating portion 120 and drive the vibrating portion 120 more stably.

Resonator 10

The vibrating portion 120 in the resonator 10 according to the embodiment is configured to undergo out-of-plane bending. The resonator 10 includes holding arms 111 and 112 instead of the holding arms 110 according to the first embodiment and includes a wiring 238 instead of the wiring 237.

The holding portion 140 according to the embodiment has a rectangular contour extending along the XY plane in an orthogonal coordinate system of FIG. 9. The vibrating portion 120 is provided in an inner side relative to the holding portion 140, and a space is formed between the vibrating portion 120 and the holding portion 140 at a predetermined interval. In an example of FIG. 9, the vibrating portion 120 includes a base portion 130 and four vibrating arms 135A to 135D (also collectively referred to as "vibrating arms 135"). Note that the number of vibrating arms is not limited to four, and is set to an arbitrary number, for example, equal to or more than one. In addition, the vibrating portion 120 is not limited to undergo the out-of-plane bending vibration and an in-plane bending resonator in the X-axis direction may be used. In the embodiment, the respective vibrating arms 135 and the base portion 130 are integrally formed.

In plan view, the base portion 130 has long sides 131a and 131b in the X-axis direction and short sides 131c and 131d in the Y-axis direction. The long side 131a is one side of a front end surface 131A (hereinafter, also referred to as a "front end 131A") of the base portion 130, and the long side 131b is one side of a rear end surface 131B (hereinafter, also referred to as a "rear end 131B") of the base portion 130. In the base portion 130, the front end 131A and the rear end 131B are provided so as to face each other.

The base portion 130 is connected to the vibrating arms 135, which will be described later, at the front end 131A, and is connected to the holding arms 111 and 112, which will be described later, at the rear end 131B. In the example of FIG. 3, the base portion 130 has the substantially rectangular shape in plan view, but is not limited thereto, and it is sufficient that the base portion 130 is formed substantially symmetrically with respect to a virtual plane P defined along a vertical bisector of the long side 131a. For example, the base portion 130 may have, for example, a trapezoidal shape whose long side 131b is shorter than the long side 131a or a semicircular shape whose long side 131a is a diameter. Further, the long sides 131a and 131b and the short sides 131c and 131d are not limited to straight lines, and may be curves.

In the base portion 130, a base portion length (a length of the short sides 131c and 131d in FIG. 9) which is a longest distance between the front end 131A and the rear end 131B in a direction from the front end 131A toward the rear end 131B is about 40 µm. In addition, a base portion width (a length of the long sides 131a and 131b in FIG. 9) which is a longest distance between the side ends of the base portion 130 in the width direction orthogonal to the direction of the base portion length is about 285 µm.

According to the exemplary aspect, the vibrating arms 135 extend in the Y-axis direction, and preferably have the same size, respectively. Each of the vibrating arms 135 is provided between the base portion 130 and the holding portion 140 in parallel to the Y-axis direction, and one end thereof is connected to the front end 131A of the base portion 130 and is a fixed end, and the other end thereof is an open end. Further, the vibrating arms 135 are provided in parallel at predetermined intervals in the X-axis direction. It is noted that the vibrating arms 135 preferably have, for example, widths of about 50 µm in the X-axis direction and lengths of about 420 µm in the Y-axis direction.

It is further noted that each of the vibrating arms 135 may have a weight portion at the open end thereof according to an exemplary aspect. The weight portion has a larger width in the X-axis direction than the other portions of the vibrating arm 135. By forming the weight portion, the weight of the vibrating arm 135 per unit length becomes larger at the open end side than that at the fixed end side. Accordingly, when each vibrating arm 135 has the weight portion at the open end side, the amplitude of vibration of each vibrating arm in the vertical direction can be increased.

In the vibrating portion 120 of the embodiment, the two vibrating arms 135A and 135D are arranged in outer side portions in the X-axis direction, and the two vibrating arms 135B and 135C are arranged in inner side portions in the X-axis direction. An interval W1 between the vibrating arms 135B and 135C in the X-axis direction is set to be larger than an interval W2 between the outer vibrating arm 135A (135D) and the inner vibrating arm 135B (135C), which is adjacent to the outer vibrating arm 135A (135D), in the X-axis direction. The interval W1 is, for example, about 30 µm, and the interval W2 is, for example, about 25 µm. By setting the interval W2 to be smaller than the interval W1, vibration characteristics are improved. In addition, in order to reduce the size of the resonance device 1, the interval W1 may be set to be smaller than the interval W2 or may be set to be an equal interval thereto.

In this embodiment, a phase of electric fields that are applied to the outer vibrating arms 135A and 135D and a phase of electric fields that are applied to the inner vibrating arms 135B and 135C are set to be opposite to each other. Thus, the outer vibrating arms 135A and 135D and the inner vibrating arms 135B and 135C are displaced in opposite directions. For example, when the outer vibrating arms 135A and 135D displace their open ends toward the inner surface of the upper lid 30, the inner vibrating arms 135B and 135C displace their open ends toward the inner surface of the lower lid 20. In other words, in the vibrating portion 120 according to the embodiment, the displacement with the vibration is maximum in the vicinity of the open ends of the vibrating arms 135.

Thus, in the resonator 10 according to the embodiment, the vibrating arm 135A and the vibrating arm 135B vibrate in the opposite phases, i.e., vibrate in directions vertically opposite to each other about a center axis r1 extending in parallel to the Y axis between the vibrating arm 135A and the vibrating arm 135B illustrated in FIG. 10. Further, the vibrating arm 135C and the vibrating arm 135D vibrate in directions vertically opposite to each other about a center axis r2 extending in parallel to the Y axis between the vibrating arm 135C and the vibrating arm 135D. Thus, torsional moments in opposite directions are generated in the center axes r1 and r2, and bending vibration is generated in the base portion 130.

The holding arm 111 and the holding arm 112 are provided in an inner side portion relative to the holding portion 140 and connect the rear end 131B of the base portion 130 and the frame bodies 140c and 140d. As illustrated in FIG. 3, the holding arm 111 and the holding arm 112 are formed substantially plane-symmetrically with respect to the virtual plane P defined in parallel to a YZ plane along a center line of the base portion 130 in the X-axis direction.

The holding arm 111 has a plurality of arms 111a, 111b, 111c and 111d. As further shown, the holding arm 111 has one end connected to the rear end 131B of the base portion 130 and extends therefrom toward the frame body 140d. The holding arm 111 is bent in a direction toward the frame body 140a (that is, in the X-axial direction), is bent in a direction toward the frame body 140c (that is, in the Y-axis direction), is bent in the direction toward the frame body 140a again (that is, in the X-axis direction), and is connected, at the other end, to the frame body 140a.

The arm 111a is provided between the base portion 130 and the frame body 140d so as to face the frame body 140a such that the longitudinal direction thereof is parallel to the Y-axis direction. The arm 111a has one end connected to the base portion 130 at the rear end 131B and extends therefrom substantially perpendicularly to the rear end 131B, i. e., in the Y-axis direction. An axis passing through the center of the arm 111a in the X-axis direction is preferably provided in an inner side portion relative to the center line of the vibrating arm 135A, and in the example of FIG. 9, the arm 111a is provided between the vibrating arms 135A and 135B. Further, the arm 111a has the other end connected to one end of the arm 111b on its side surface. The arm 111a has a width of about 20 µm, which is defined in the X-axis direction, and a length of about 40 which is defined in the Y-axis direction.

The arm 111b is provided between the base portion 130 and the frame body 140d so as to face the frame body 140d such that the longitudinal direction thereof is parallel to the X-axis direction. The arm 111b has one end connected to the other end of the arm 111a, which is a side surface thereof at the side facing the frame body 140a, and extends therefrom substantially perpendicularly to the arm 111a, i.e., in the X-axis direction. Further, the arm 111b has the other end connected to one end of the arm 111c, which is a side surface thereof at the side facing the vibrating portion 120. For example, the arm 111b has a width of about 20 μm, which is defined in the Y-axis direction, and a length of about 75 μm, which is defined in the X-axis direction.

The arm 111c is provided between the base portion 130 and the frame body 140a so as to face the frame body 140a such that the longitudinal direction thereof is parallel to the Y-axis direction. The arm 111c has one end connected to the other end of the arm 111b on its side surface and has the other end connected to one end of the arm 111d, which is a side surface thereof at the frame body 140a side. For example, the arm 111c has a width of about 20 μm, which is defined in the X-axis direction, and a length of about 140 μm, which is defined in the Y-axis direction.

The arm 111d is provided between the base portion 130 and the frame body 140a so as to face the frame body 140c such that the longitudinal direction thereof is parallel to the X-axis direction. The arm 111d has one end connected to the other end of the arm 111c, which is a side surface at the side facing the frame body 140a. Further, the arm 111d has the other end connected to the frame body 140a at a position facing the vicinity of a connection place between the vibrating arm 135A and the base portion 130, and extends therefrom substantially perpendicularly to the frame portion 140a, i. e., in the X-axis direction. For example, the arm 111d has a width of about 20 μm, which is defined in the Y-axis direction, and a length of about 40 μm, which is defined in the X-axis direction.

As described above, the holding arm 111 is connected to the base portion 130 at the arm 111a, is bent at a connection place between the arm 111a and the arm 111b, is bent at a connection place between the arms 111b and 111c, and is bent at a connection place between the arms 111c and 111d, and then, is connected to the holding portion 140.

The holding arm 112 has a plurality of arms 112a, 112b, 112c and 112d. Moreover, as also shown, the holding arm 112 has one end connected to the rear end 131B of the base portion 130 and extends therefrom toward the frame body 140d. The holding arm 112 is bent in the direction toward the frame body 140b (that is, in the X-axis direction), is bent in the direction toward the frame body 140c (that is, in the Y-axis direction), is bent again in the direction toward the frame body 140b (that is, in the X-axis direction), and is connected, at the other end, to the frame body 140b.

It is noted that the configurations of the arms 112a, 112b, 112c and 112d are symmetrical to those of the arms 111a, 111b, 111c and 111d, respectively, and therefore, detailed description thereof will be omitted.

In this embodiment, the conductive portion 236 is formed in a region on the frame body 140c, which faces the open ends (i.e., the maximum displacement region) of the vibrating arms 135. Specifically, the conductive portion 236 is formed on the frame body 140c along an inner edge of the holding portion 140 from a region facing the vibrating arm 135A to a region facing the vibrating arm 135D. As described in the first embodiment, the conductive portion 236 is provided at a position at which an inner edge thereof is substantially coincides with the inner edge of the holding portion 140 and an outer edge thereof may be located between the inner edge and an outer edge of the holding portion 140 in plan view.

The terminal 51 is formed on the frame body 140a in the vicinity of the connection place with the holding arm 111. Other configurations of the terminal 51 are the same as those of the terminal 51 in the first embodiment.

The wiring 238 draws the conductive portion 236 and connects it to the terminal 51.

The other configurations and effects of the resonance device 1 are the same as those of the first embodiment.

Fourth Exemplary Embodiment

Figure 11:
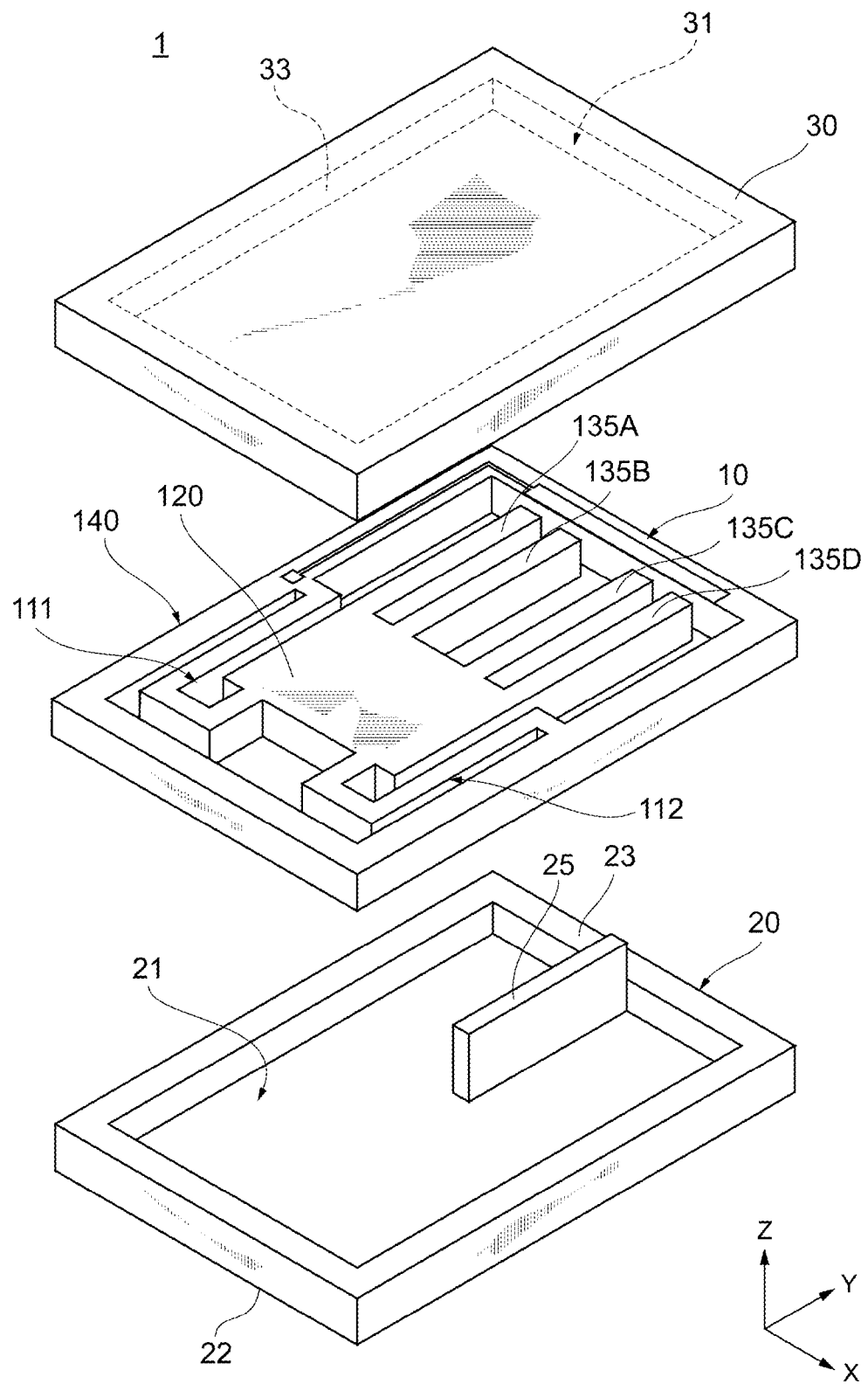
FIG. 11 is an exploded perspective view of a resonance device according to a fourth exemplary embodiment.
Figure 12:
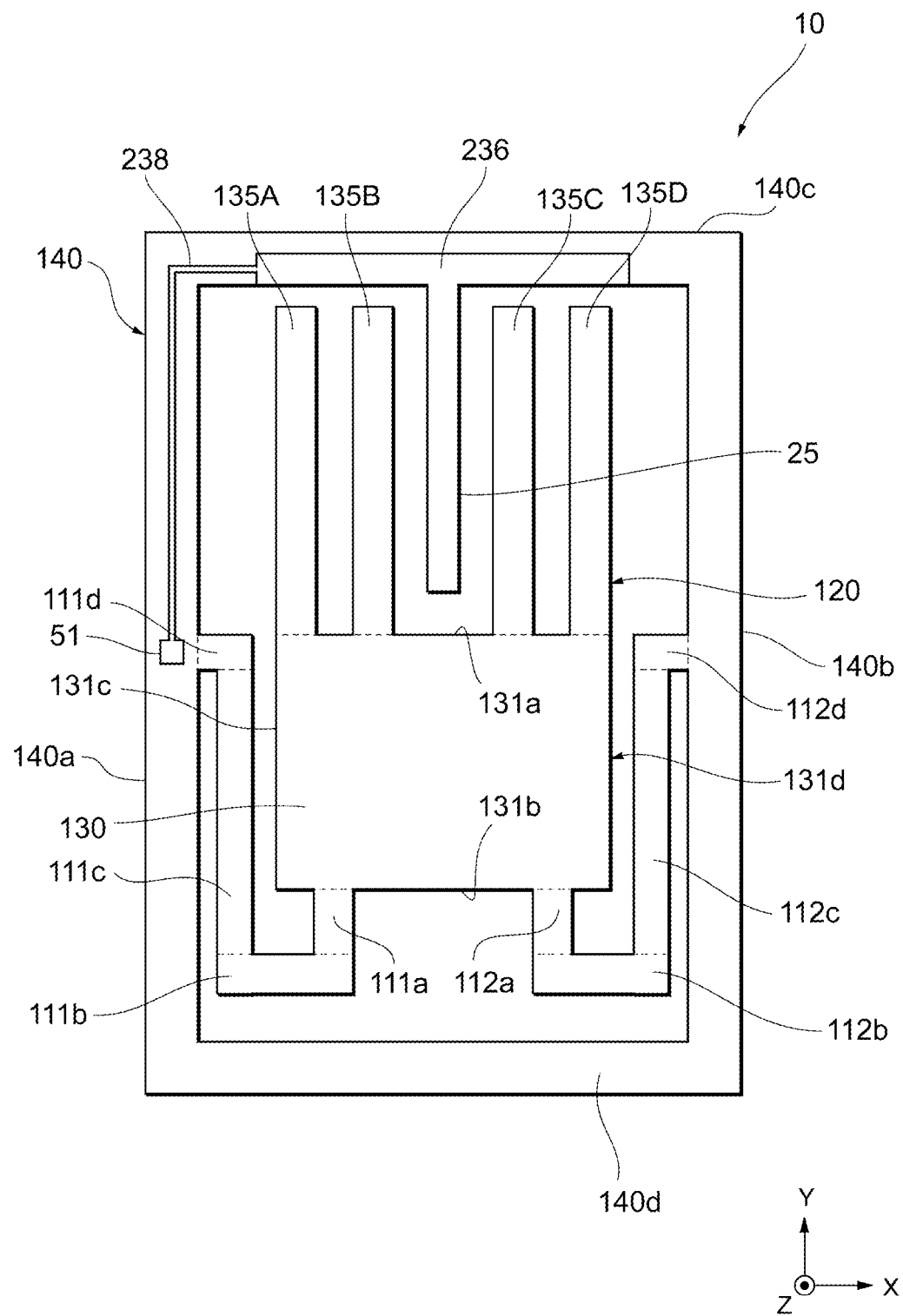
FIG. 12 is a plan view of a resonator according to the fourth exemplary embodiment.

Referring to FIGS. 11 and 12, description will be mainly given to different points from the third embodiment in the detailed configuration of the resonator 10 according to the embodiment. FIG. 11 is an exploded perspective view of the resonance device 1 according to the embodiment. Further, FIG. 12 is a plan view schematically illustrating an example of the configuration of the resonator 10 according to the embodiment (for simplification of explanation, the joining layer 35 is omitted from FIG. 12 in the same way as in FIG. 3). It is noted that although a projection 25 is a component of the lower lid 20, it is also illustrated in FIG. 12 for ease of explanation.

Lower Lid 20

In this embodiment, the projection 25 projecting into a vibration space is formed on the surface of the bottom plate 22 in the recess 21 and extends upwards in the vibration space. The projection 25 is formed on the bottom plate 22 at a position facing a space between the vibrating arms 135B and 135C, i.e., at a position facing the projection 25 (see FIG. 11). In this embodiment, the projection 25 is formed in a prismatic shape extending in parallel to the vibrating arms 135B and 135C. By forming the projection 25 on the lower lid 20, it is possible to ensure rigidity of the lower lid 20. Accordingly, even if the thickness of the lower lid 20 is reduced, for example, in order to reduce the thickness of the resonance device 1, it is possible to suppress occurrence of warpage of the lower lid 20.

Resonator 10

In this embodiment, the conductive portion 236 is formed from the vicinity of a region on the body 140c, which faces the open ends of the vibrating arms 135, to the surface of the projection 25. By forming the conductive portion 236 on the projection 25, it is possible to prevent charging in the vicinity of the vibrating portion 120 and drive the vibrating portion 120 more stably.

The other configurations and functions of the resonance device 1 are the same as those of the first embodiment.

Fifth Exemplary Embodiment

Figure 13:
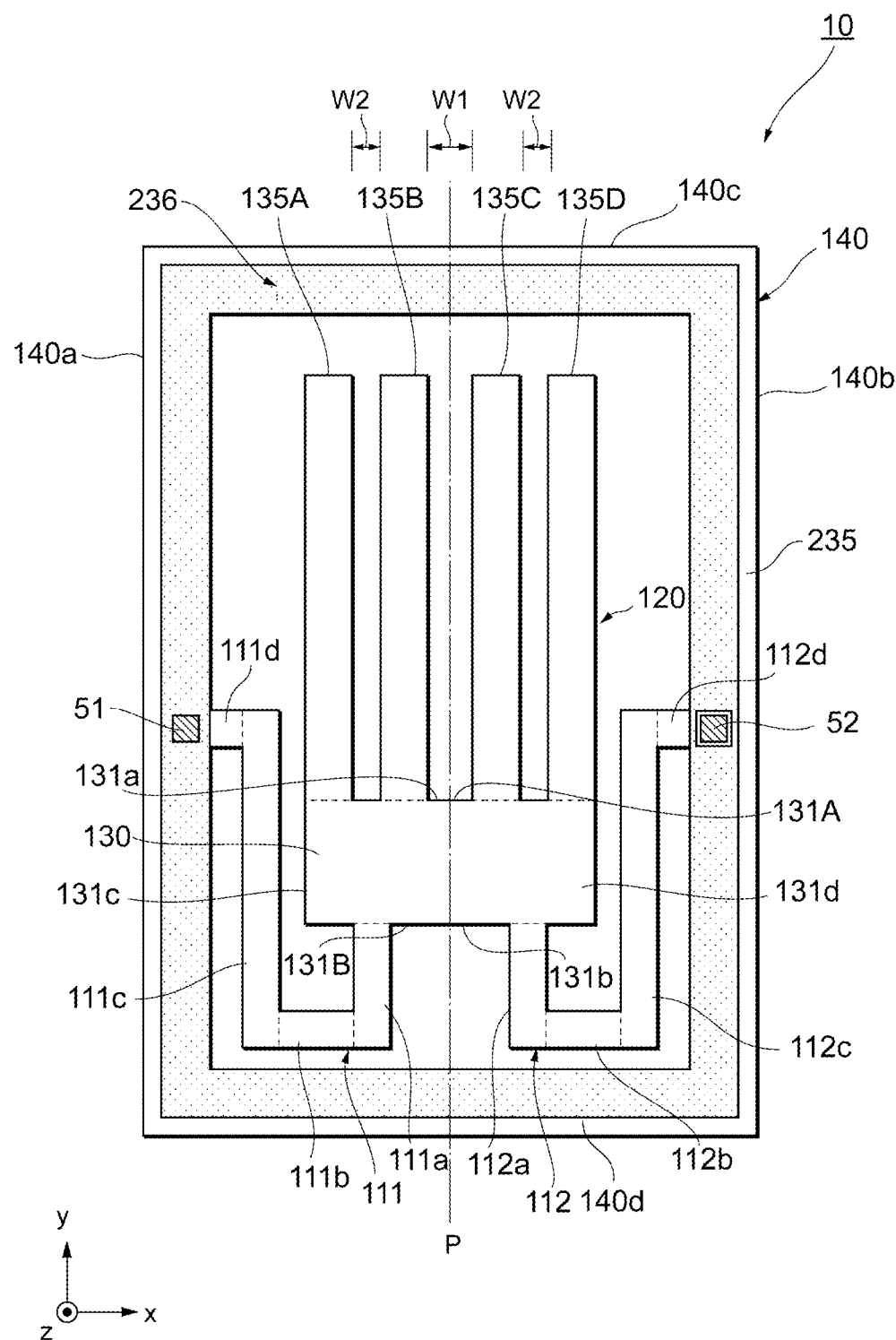
FIG. 13 is a plan view of a resonator according to a fifth exemplary embodiment.

Referring to FIG. 13, description will be mainly given to different points from the third embodiment in the detailed configuration of the resonator 10 according to the embodiment. FIG. 13 is a plan view schematically illustrating an example of the configuration of the resonator 10 according to the embodiment (for simplification of explanation, the joining layer 35 is omitted from FIG. 13 in the same way as in FIG. 3).

In this embodiment, the conductive portion 236 is formed over the entire periphery of the holding portion 140 excluding a region where the joining layer 35 is formed, a gap with the region, and a gap with the terminal 52 (in FIG. 13, regions of the holding portion 140 where the insulating film 235 is exposed are regions where any of the gaps and the joining layer 35 is formed). The terminal 51 is connected to the conductive portion 236 whereas a predetermined gap is formed between the terminal 52 and the conductive portion 236 and the terminal 52 is not connected to the conductive portion 236.

In the regions where the insulating film 235 is exposed, influences by electric charges on the insulating film 235 are generated. Therefore, in order to stabilize characteristics, as illustrated in FIG. 13, the conductive portion 236 is formed over a wider range of the regions where the insulating film 235 is exposed, connect the conductive portion 236 to the lower portion or the upper electrode, and release the electric charges. Further, it is more desirable that the conductive portion 236 be formed in a portion of the vibrating portion 120 in which the insulating film 235 is exposed to thereby release the electric charges in addition to the holding portion 140.

The other configurations and functions of the resonance device 1 are the same as those of the first embodiment.

As described above, exemplary embodiments of the invention have been described. The resonator 10 according to one exemplary embodiment includes the vibrating portion 120 that has the piezoelectric film F3, and the lower electrode (metal layer E1) and the upper electrode (metal layer E2) provided to face each other with the piezoelectric film F3 interposed therebetween. Moreover, the holding portion 140 is provided at least around the maximum displacement region of the vibrating portion 120 in which the displacement with the vibration is maximum, and has the insulating film 235. Furthermore, the holding arms 110 connect the vibrating portion 120 and the holding portion 140, and the conductive portion 236 is formed in contact with the insulating film 235 of the holding portion 140 in at least the region of the holding portion 140, which faces the maximum displacement region of the vibrating portion 120. In an exemplary aspect, the conductive portion 236 is electrically connected to the lower electrode (metal layer E1) or the upper electrode (metal layer E2) or is grounded. As described above, in the resonator 10 according to the embodiment, the configuration is such that the conductive portion 236 is formed so as to make contact with the insulating film 235 and is connected to the terminal 51 connected to the outer electrode. Thus, the electric charges accumulated in the charged insulating film 235 can be released to the outside of the resonance device 1 while passing through the terminal 51 which is a connection terminal to the outside. In this way, in the resonator 10 according to the embodiment, it is possible to suppress the insulating film 235 formed on the holding portion 140 from being charged and thus prevent the resonant frequency from varying due to the electric charge accumulated in the holding portion 140.

Further, it is preferable that the holding portion 140 be provided in the frame shape surrounding the vibrating portion 120. It is also preferable that the conductive portion 236 be provided in contact with the inner edge of the frame-shaped holding portion 140.

In addition, it is preferable that the vibrating portion 120 be a contour resonator having a rectangular contour and the conductive portions 236 be provided at least in the regions of the holding portion 140, which face the four corners of the vibrating portion 120. Moreover, it is preferable that the vibrating portion 120 be the bending resonator including the base portion 130 and the plurality of vibrating arms 135 whose one side ends are the fixed ends connected to the front end of the base portion 130 and whose the other side ends are the open ends provided in the direction away from the front end. In this aspect, the conductive portion 236 is preferably provided in the region of the holding portion 140, which faces the open ends of the vibrating arms 135. According to these preferred embodiments, in the resonator 10, it is possible to prevent the insulating film 235 formed on the holding portion 140 from being charged and thus prevent the resonant frequency from varying due to the electric charges accumulated in the holding portion 140. As a result, the vibrating portion 120 can be driven more stably.

The resonance device 1 according to one embodiment of the invention includes the above-described resonator 10, the upper lid 30 and the lower lid 20 provided so as to face each other with the resonator 10 interposed therebetween, and the outer electrode connected to any one of the lower electrode (metal layer E1) and the upper electrode (metal layer E2). As described above, in the resonance device 1 according to the embodiment, the configuration is such that the conductive portion 236 is formed so as to make contact with the insulating film 235 and is connected to the terminal 51 connected to the outer electrode. Thus, the electric charges accumulated in the charged insulating film 235 can be released to the outside of the resonance device 1 while passing through the terminal 51 which is the connection terminal to the outside. In this way, in the resonator 10 according to the embodiment, it is possible to suppress the insulating film 235 formed on the holding portion 140 from being charged and thus prevent the resonant frequency from varying due to the electric charge accumulated in the holding portion 140.

Further, in the resonance device 1, it is preferable that the upper lid 30 or the lower lid 20 have another film 37 or 27 on the surface thereof facing the resonator 10. As a result, the vibrating portion 120 can be driven more stably.

Each of the exemplary embodiments has been described above for facilitating understanding of the invention and is not intended to limit the invention. It should be appreciated that the invention can be modified and improved without departing from the spirit of the invention and also encompasses equivalents thereof. In other words, the scope of the invention covers those provided by appropriately adding changes in design to each of the embodiments by those skilled in the art as long as they include characteristics of the invention. For example, the elements, and the arrangements, the materials, the conditions, the shapes, the sizes, and the like thereof in each of the embodiments are not limited to exemplified ones, and can be appropriately changed. It is needless to say that each of the embodiments is illustrative and the configurations described in different embodiments can be partially replaced or combined. The invention also encompasses them as long as they include characteristics of the invention.

REFERENCE SIGNS LIST

1 RESONANCE DEVICE
10 RESONATOR
30 UPPER LID
20 LOWER LID
140 HOLDING PORTION
140a TO 140d FRAME BODY
111, 112 HOLDING ARM
120 VIBRATING PORTION
130 BASE PORTION
135A TO 135D VIBRATING ARM
F2 Si SUBSTRATE
F1 SILICON OXIDE LAYER (TEMPERATURE CHARACTERISTIC CORRECTION LAYER)
235 INSULATING FILM
236 CONDUCTIVE PORTION

The invention claimed is:

1. A resonator comprising:
a vibrating portion including a piezoelectric film and lower and upper electrodes that face each other with the piezoelectric film disposed therebetween;
a holding member having a framing shape that surrounds the vibration portion and including an insulating film and being disposed at least around a maximum displacement region of the vibrating portion;
a holding arm that connects the vibrating portion to the holding member; and
a conductive portion disposed in contact with the insulating film of the holding member at least in a region of the holding member that faces the maximum displacement region of the vibrating portion,
wherein the conductive portion is electrically connected to one of the lower electrode and the upper electrode or is grounded, and
wherein the conductive portion is disposed in contact with an inner edge of the holding member.

2. The resonator according to claim 1, wherein the inner edge of the holding member faces the vibrating portion.

3. The resonator according to claim 1,
wherein the vibrating portion is a contour resonator having a rectangular contour, and
wherein the conductive portion is disposed at least in regions of the holding member that face four corners of the vibrating portion.

4. The resonator according to claim 3, wherein the conductive portion comprises a plurality of conductive portions comprising fan-like shapes that extend an inner edge of the holding portion toward an outer edge thereof.

5. The resonator according to claim 1, wherein the vibrating portion includes a base and a plurality of vibrating arms that each have first ends that are fixed to a front end of the base and second ends that are open ends extending in a direction away from the front end of the base.

6. The resonator according to claim 5, wherein the conductive portion is disposed in a region of the holding member that faces the open ends of the plurality of vibrating arms.

7. A resonance device comprising:
the resonator according to claim 1;
an upper lid and a lower lid that face each other with the resonator interposed therebetween; and
an outer electrode connected to one of the upper electrode and the lower electrode.

8. The resonance device according to claim 7, wherein at least one of the upper lid and the lower lid comprises an additional conductive portion on a surface thereof that faces the resonator.

9. The resonator according to claim 1, wherein the vibrating portion is configured to vibrate in a predetermined vibration mode.

10. The resonator according to claim 1, further comprising a pair of terminals disposed on the holding member, with a first terminal of the pair of terminals connected to the lower electrode and a second terminal of the pair of terminals connected to the upper electrode.

11. The resonator according to claim 10, wherein the conductive portion is in direct contact with the insulating film and is connected to one of the first and second terminals.

12. The resonator according to claim 11, wherein the conductive portion is configured to suppress the insulating film from being charged by releasing electric charges accumulated in the insulating film to the first or second terminal connected thereto.

13. A resonator comprising:
a vibrating member that includes a pair of electrodes disposed on opposing surfaces of a piezoelectric film;
a frame surrounding the vibrating member and having an insulating film and disposed around a maximum displacement region of the vibrating member;
a holding arm that connects the vibrating member to the frame; and
a conductive film disposed in direct contact with the insulating film of the frame at least in a region of the frame that faces the maximum displacement region of the vibrating member,
wherein the conductive film is electrically connected to one of the pair of electrodes, such that the conductive film is configured to suppress the insulating film from being charged by releasing electric charges accumulated in the insulating film, and
wherein the conductive film is disposed in contact with an inner edge of the frame.

14. The resonator according to claim 13, further comprising a pair of terminals disposed on the frame and respectively connected to the pair of electrodes.

15. The resonator according to claim 14, wherein the conductive film is in direct contact with the insulating film and is connected to one of the pair of terminals, such that the conductive film is configured to release the electric charges accumulated in the insulating film to terminal connected thereto.

16. The resonator according to claim 13, wherein the vibrating member is a contour resonator having a rectangular contour, with the conductive film being disposed at least in regions of the frame that face four corners of the vibrating member.

17. The resonator according to claim 13, wherein the vibrating member includes a base and a plurality of vibrating arms that each have first ends that are fixed to a front end of the base and second ends that are open ends extending in a direction away from the front end of the base.

18. The resonator according to claim 17, wherein the conductive film is disposed in a region of the frame that faces the open ends of the plurality of vibrating arms.

* * * * *